United States Patent
Kondo

(10) Patent No.: US 6,836,433 B2
(45) Date of Patent: Dec. 28, 2004

(54) REWRITE DISABLE CONTROL METHOD FOR DETERMINING REWRITE ENABLE/DISABLE BASED ON RESULT OF MAJORITY DECISION

(75) Inventor: Takao Kondo, Kawasaki (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 10/610,627

(22) Filed: Jul. 2, 2003

(65) Prior Publication Data

US 2004/0004858 A1 Jan. 8, 2004

(30) Foreign Application Priority Data

Jul. 4, 2002 (JP) ........................................ 2002-195768

(51) Int. Cl.[7] .............................................. G11C 16/04
(52) U.S. Cl. ............................ 365/185.04; 365/185.29; 365/185.14; 365/185.22
(58) Field of Search ..................... 365/185.04, 185.29, 365/185.33, 185.14, 185.28, 185.08, 185.11, 185.22, 195, 218

(56) References Cited

U.S. PATENT DOCUMENTS 6,000,004 A * 12/1999 Fukumoto ................... 711/103
6,044,014 A * 3/2000 Komori et al. ............ 365/185.04
6,597,602 B2 * 7/2003 Imamiya et al. .......... 365/185.04

FOREIGN PATENT DOCUMENTS

| JP | 2000-181898 A | 6/2000 |
| JP | 2000-268584 A | 9/2000 |

* cited by examiner

Primary Examiner—Richard Elms
Assistant Examiner—Dang T Nguyen
(74) Attorney, Agent, or Firm—Sughrue Mion, PLLC

(57) ABSTRACT

A rewrite disable control method for a non-volatile semiconductor storage device is disclosed for relying on a majority decision to determine whether a rewrite is disabled or enabled. A write disable control signal generating circuit reads three write disable flags of the same contents stored in security flag storage areas of three memory blocks, respectively, and makes a majority decision to determine a disable/enable state to establish the logic of a write disable control signal. Even if a power supply is instantaneously interrupted during an erasure of a certain block to cause a change in the security flag associated with one memory block, the security flags stored in the two remaining memory blocks maintain the original values, thereby making it possible to effectively prevent a trouble in which an unintended disable setting is validated. Also, since the disable/enable state is directly set by hardware in accordance with the values of the security flags, a malicious third party can be prevented from rewriting a program using a flash memory writer.

4 Claims, 4 Drawing Sheets

Fig. 2

| signal from memory block $50_1$ | signal from memory block $50_2$ | signal from memory block $50_3$ | write disable control signal 20 |
|---|---|---|---|
| 1 | 1 | 1 | 1 |
| 1 | 1 | 0 | 1 |
| 1 | 0 | 1 | 1 |
| 0 | 1 | 1 | 1 |
| 0 | 0 | 1 | 0 |
| 0 | 1 | 0 | 0 |
| 1 | 0 | 0 | 0 |
| 0 | 0 | 0 | 0 |

Fig. 3

| security flags | | | behaviors in the flash memory writer | | |
|---|---|---|---|---|---|
| write disable | chip erasure disable | block erasure disable | write | chip erasure | block erasure |
| O | O | X | O | O | X |
| O | X | — | O | X | X |
| X | O | O | X | O | X |
| X | X | — | X | X | X |

O : enable
X : disable
— : indefinite

REWRITE DISABLE CONTROL METHOD FOR DETERMINING REWRITE ENABLE/DISABLE BASED ON RESULT OF MAJORITY DECISION

BACKGROUND OF THE INVENTION

1. Field of the Invention

The present invention relates to a non-volatile semiconductor storage device which holds data even after power is turned off, and more particularly to a write control method for disabling a rewrite of data which has been once written into a non-volatile semiconductor storage device.

2. Description of the Related Art

In recent years, non-volatile semiconductor storage devices (hereinafter called the "semiconductor memory") which hold data even after power is turned off, such as EEPROM (Electrically Erasable and Programmable Read Only Memory), flash memory and the like have been used in a variety of applications.

Such a non-volatile memory permits a rewrite even after data for a program and the like has been once written therein. For this reason, in some applications which employ the non-volatile memory, it is required that once data has been written into the non-volatile memory, the contents of data cannot be read therefrom or overwritten by other data. For example, when a program for controlling an engine of an automotive vehicle is written into a non-volatile memory which is then supplied, a safety problem would arise if a general user who purchased the automotive vehicle could read out and modify the program.

Such a problem can be solved if a program is written into a mask ROM for use in a situation as mentioned above. However, manufacturing of mask ROM involves previously fabricating masks, which require extra time for the fabrication, thereby limiting a time period available for developing a program. Also, when the program should be modified due to bugs found therein, the program in the mask ROM cannot be modified until its masks are fabricated again for debugging. For the reasons set forth above, it is a general tendency that non-volatile memories such as a flash memory are used at an initial stage of the development of a program, instead of the mask ROM.

The requirements as described above have been addressed, for example, by Japanese Patent Application Laid Open No.2000-181898 which proposes a non-volatile memory that disables a rewrite after data has been once written therein.

Specifically, Japanese Patent Application Laid Open No.2000-181898 discloses a non-volatile memory based on a flash memory which comprises a programming area and an area for storing management information for the programming area, arranged in a one-to-one correspondence, such that a CPU, in response to a programming request from the outside, refers to the management information storing area to determine whether the programming is enabled or disabled into the programming area.

However, this conventional method involves the determination on whether the programming is enabled or disabled, made by the CPU which reads the management information, so that if a malicious third party modifies a program itself of the CPU, the flash memory can be programmed in a programming area even if the management information associated therewith disables a rewrite of the contents in the programming area.

SUMMARY OF THE INVENTION

It is an object of the present invention to provide a non-volatile semiconductor storage device which effectively disables a malicious third party to rewrite data stored therein, and a rewrite disable control method for use with the non-volatile semiconductor storage device.

The non-volatile semiconductor storage device according to the present invention is applied to a non-volatile semiconductor storage device which has a storage area made up of a plurality of memory blocks, where data is erased memory block by memory block. To achieve the above object, in the non-volatile semiconductor storage device of the present invention, each of at least three of the plurality of memory blocks store a security flag of the same content indicative of a rewrite disable state. A rewrite control circuit is provided for making a majority decision on the values of the three or more stored security flags to determine a rewrite disable/enable state to establish the logic of a disable control signal based on the result of the determination. Then, the rewrite control circuit controls disabling or enabling a rewrite to the storage area based on the logic of the disable control signal.

According to the present invention, the security flags each indicative of a rewrite disable state are stored in a security flag storage area provided in the storage area, and the disable/enable state is directly set by hardware, i.e., the rewrite control circuit in accordance with the values of the stored security flags. Therefore, for a certain program stored in the storage area of the non-volatile semiconductor storage device, if a subsequent rewrite, such as an erasure and an overwrite, is to be disabled, the security flags can be set in accordance with particular behaviors which should be disabled, to prevent a malicious third party from rewriting the stored program.

Also, in the non-volatile semiconductor storage device of the present invention, the security flags of the same contents are stored in at least three or more memory blocks, such that the rewrite control circuit makes a majority decision on the values of the three or more security flags to determine the disable/enable state. Therefore, even if an instantaneous power supply interruption or the like occurs during an erasure of a certain memory block to unintentionally rewrite the security flag in one memory block, the security flags stored in the remaining two or more memory blocks maintain the original values, thereby making it possible to prevent problems such as validation of unintended disable setting.

The security flag may comprise a write disable flag indicative of a disable/enable state for a new data write into the storage area and a disable/enable state for an erasure in blocks; a block erasure disable flag indicative of a disable/enable state for an erasure in blocks; and a chip erasure disable flag indicative of a disable/enable state for a collective erasure of the overall storage area and a disable/enable state for an erasure in blocks, wherein the disable control signal may comprise a write disable control signal, a block erasure disable control signal and a chip erasure disable control signal.

The above and other objects, features and advantages of the present invention will become apparent from the following description with reference to the accompanying drawings which illustrate examples of the present invention.

BRIEF DESCRIPTION OF THE DRAWINGS

FIG. 2 is a table showing an input/output relationship of write disable control signal generating circuit 11 in FIG. 1;

FIG. 3 is a table showing respective security flags and associated behaviors in a flash memory writer.

DETAILED DESCRIPTION OF THE PREFERRED EMBODIMENTS

Figure 1:
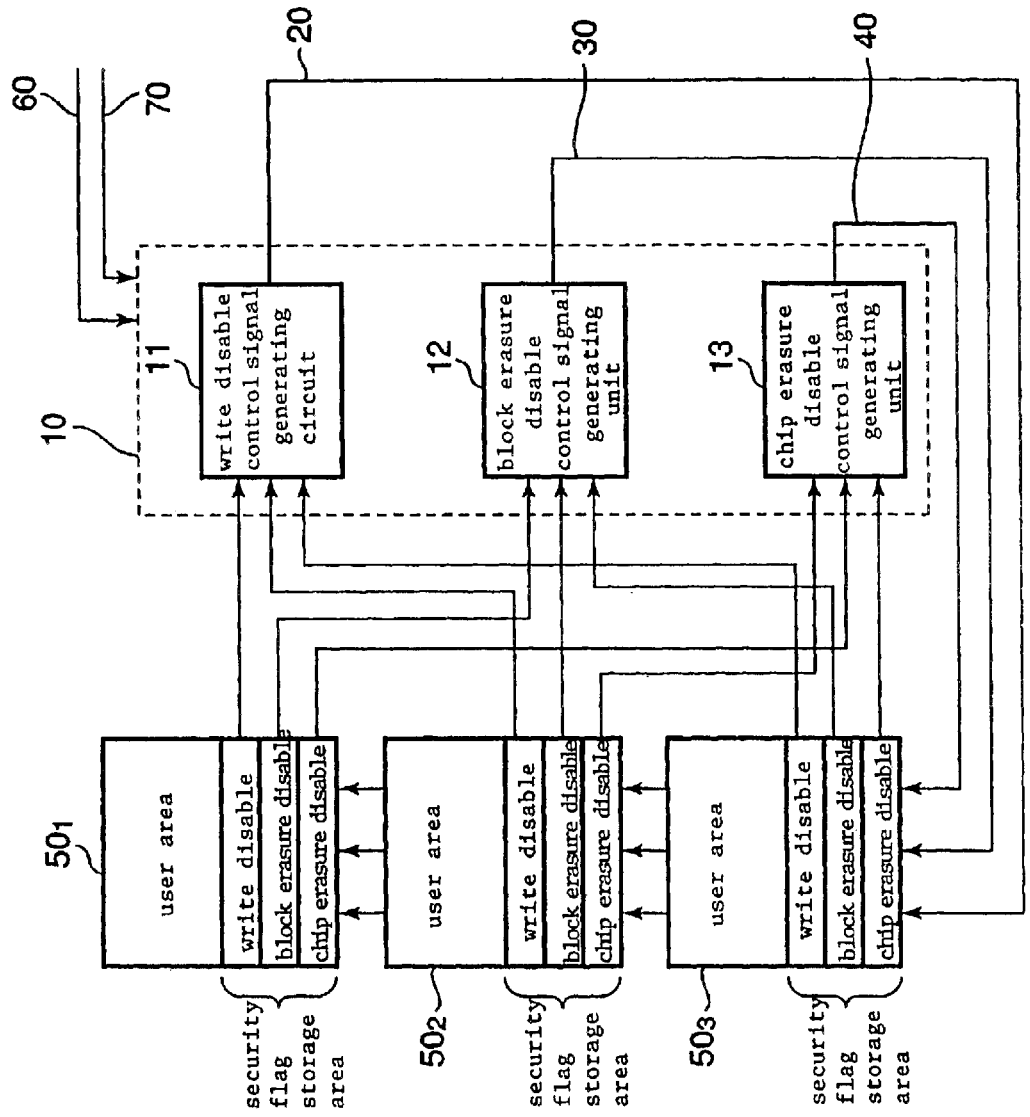
FIG. 1 is a block diagram illustrating the configuration of a non-volatile semiconductor storage device according to one embodiment of the present invention.

Next, one embodiment of the present invention will be described in detail with reference to the accompanying drawings. FIG. 1 is a block diagram illustrating the configuration of a non-volatile semiconductor storage device according to one embodiment of the present invention.

As illustrated in FIG. 1, the non-volatile semiconductor storage device according to this embodiment comprises storage area composed of three memory blocks $50_1$–$50_3$; and a rewrite control circuit 10. It should be noted that in the embodiment described below, a flash memory is used as the non-volatile semiconductor storage device.

Each of three memory blocks $50_1$–$50_3$ is divided into a user area for the user to write data such as program codes; and a security flag storage area for storing security flags such as a write disable flag, a block erasure disable flag, a chip erasure disable flag, and the like. In this embodiment, each of the security flags has a 1-bit length, and the security flag storage area occupies three bits.

Here, the write disable flag is a flag which indicates a disable/enable state for writing new data into the storage area, and a disable/enable state for erasing in blocks; the block erasure disable flag is a flag which indicates a disable/enable state for erasing data in blocks; and the chip erasure disable flag is a flag which indicates a disable/enable state for collectively erasing the overall storage area, and a disable/enable state for erasing in blocks.

Therefore, when either the write disable flag or chip erasure disable flag indicates a disable state, a block erasure is disabled even if the block erasure disable flag indicates an enable state.

In this flash memory, when a certain memory block is erased, the security flag storage area and user area are simultaneously erased in the memory block to prevent data from remaining in either of the areas. Also, when the flash memory is erased in whichever method, the erasure is internally made memory block by memory block without exception.

Rewrite control circuit 10 comprises write disable control signal generating circuit 11; block erasure disable control signal generating circuit 12; and chip erasure disable control signal generating circuit 13.

Write disable control signal generating circuit 11 reads the write disable flags from the respective security flag storage areas of memory block $50_1$–$50_3$, decides the values of the three read write disable flags by majority to determine a write disable/enable state, and determines the logic for write disable control signal 20 based on the result of the determination.

Specifically, when two or more of the three read write disable flags are "0" which indicates a disable state, write disable control signal generating circuit 11 sets write disable control signal 20 to low level which indicates "write disable." On the other hand, when two or more of the three read write disable flags are "1" which indicates an enable state, write disable control signal generating circuit 11 sets write disable control signal 20 to high level which indicates "write enable."

FIG. 2 shows the input/output relationship involved in write disable control signal generating circuit 11 as described above. It should be noted that block erasure disable control signal generating circuit 12 and chip erasure disable control signal generating circuit 13 also have similar input/output relationships except that they receive the block erasure disable flag and chip erasure disable flag, respectively, and that they deliver block erasure disable control signal 30 and chip erasure disable control signal 40, respectively, so that description thereon is omitted.

Rewrite control circuit 10 receives onboard mode signal 60 and self-programming mode signal 70.

When the flash memory is set in a flash memory writer mode, onboard mode signal 60 becomes active, thereby enabling a program to be written into the flash memory mounted on a target system (onboard) using a flash memory writer from the outside. When the flash memory is set in a self-programming mode, self-programming mode signal 70 becomes active, initiating a program previously written into any memory block to read a program from the outside and write the program into a memory block.

For determining the mode, it is first determined whether the flash memory is in the flash memory writer mode or normal mode. When a particular terminal goes to high level in the normal mode, the flash memory transitions to the self-programming mode. Here, the normal mode refers to a mode in which a user program is executed. In this normal mode, onboard mode signal 60, self-programming mode signal 70 are both inactive.

The foregoing security flags can be set after a program has been written into the flash memory in the flash memory writer mode.

In the self-programming mode, write disable control signal 20, block erasure disable control signal 30, and chip erasure disable control signal 40 are at high level, releasing any limits on rewriting.

At the time onboard mode signal 60 becomes active to set the flash memory in the flash memory writer mode, write disable control signal 20, block erasure disable control signal 30 and chip erasure disable control signal 40 have initial values which are set to low level without exception, thereby disabling a rewrite.

Next, FIG. 3 shows the relationship between the respective security flags and resulting behaviors in the flash memory writer.

"Write disable" used herein means to disable a new data write into the flash memory. "Block erasure disable" in turn means to disable an erasure of data in blocks, while "chip erasure disable" means to disable a collective erasure of data in the overall flash memory chip.

The flash memory in this embodiment comprises three memory blocks $50_1$–$50_3$ and rewrite control circuit 10 which decides the respective security flags by majority to establish the logic of write disable control signal 20, block erasure disable control signal 30 and chip erasure disable control signal 40 for the reason set forth below.

If the security flags are stored in only one memory block to decide the logic of the disable control signals such as write disable control signal 20, block erasure disable control signal 30, chip erasure disable control signal and the like based only on these security flags, the following problem can arise in the event of instantaneous interruption of power supply, and the like.

When the power supply is instantaneously interrupted during the progress of erasing a program in the flash memory writer mode resulting from onboard mode signal 60 becoming active, the security flags can have indefinite values which would validate an unintended disable setting. Once in such a state, subsequent rewrite would be disabled, so that any rewrite would be subsequently disabled, even though no correct program has been written into the user area, thereby failing to permit a normal return.

In another case, if the power is instantaneously interrupted in the progress of erasing a certain user area in the self-programming mode, assuming that only 1-bit security flag is stored in a memory block including the user area, the security flag will suffer from an indefinite value, possibly validating an unintended disable setting.

Particularly, a flash memory and the like involve a pre-write for once performing a write before written data is erased to set voltage levels held in all memory cells at the same level. Therefore, if the power supply is instantaneously interrupted while a certain memory block is being rewritten, a security flag in the security flag storage area of the memory block, which should be essentially at low level, could transition to high level.

As described above, in the flash memory, an erasure is internally made block by block without exception in whichever method, so that data in two or more memory blocks will never become indefinite even if the power supply is instantaneously interrupted during the erasure. Thus, with the security flags of the same contents distributively stored in three or more memory blocks, even if the security flag stored in a certain memory block is unintentionally rewritten, the security flags stored in the two or more remaining memory blocks hold correct values. As such, the security flags distributively stored in the three memory blocks may be read therefrom for making a majority decision to determine a correct value for the security flags, thereby avoiding problems such as the validation of an unintended disable setting even if the value of the security flag stored in a certain memory block is rewritten due to instantaneous interruption of power supply or the like.

Figure 4:
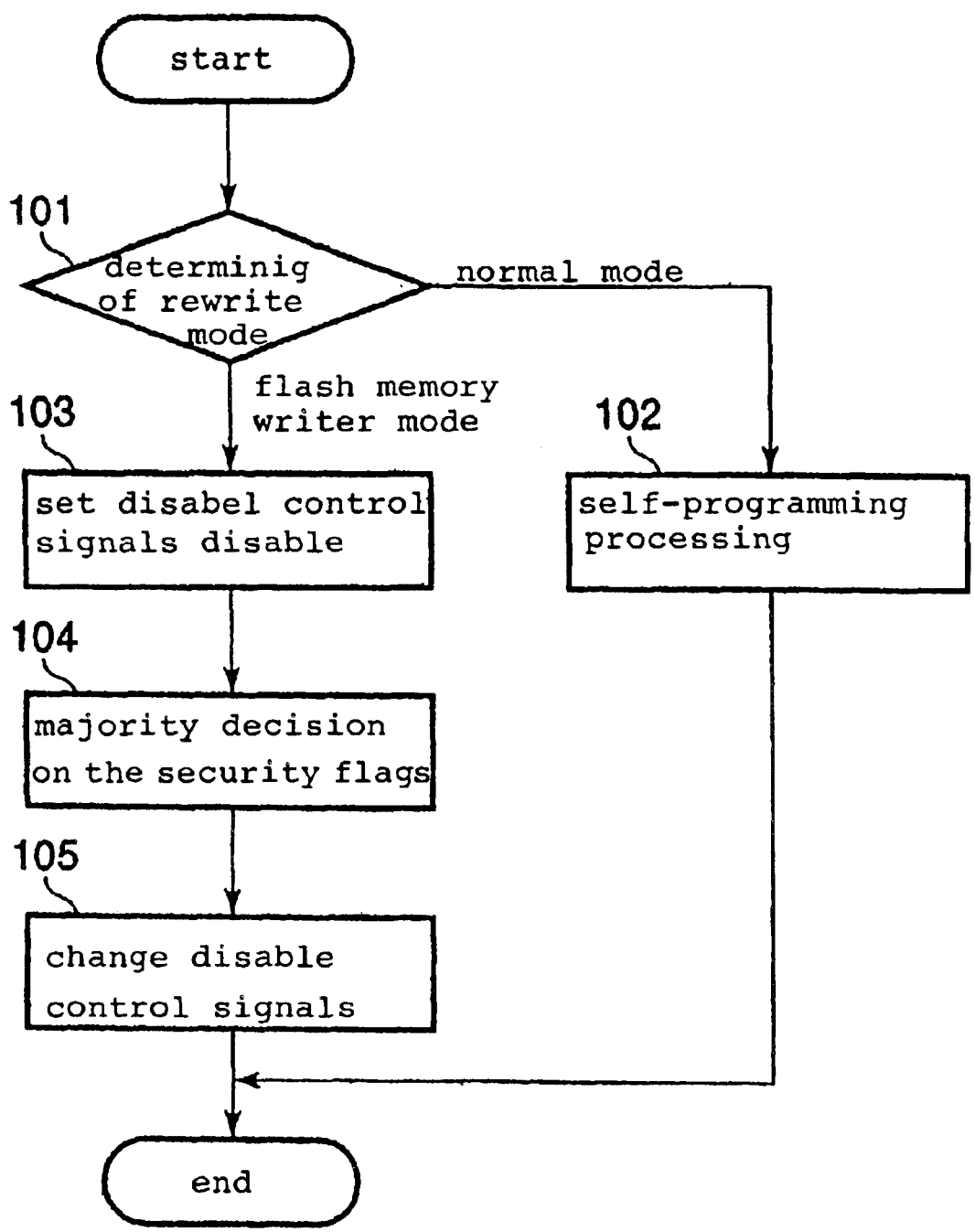
FIG. 4 is a flow chart illustrating the operation of rewrite control circuit 10.

Next, the operation of rewrite control circuit 10 in the non-volatile semiconductor storage device according to this embodiment will be described with reference to a flow chart of FIG. 4.

First, at step 101, rewrite control circuit 10 determines whether the flash memory is in a mode in which a rewrite is enabled. Specifically, rewrite control circuit 10 determines that the flash memory is in the flash memory writer mode when onboard mode signal 60 is active and self-programming mode signal 70 is inactive, and determines that the flash memory is in the normal mode when onboard signal 60 and self-programming mode signal 70 are both inactive.

When the flash memory is determined to be in the normal mode at step 101, rewrite control circuit 10 sets all of the disable control signals such as write disable control signal 20, block erasure disable control signal 30, chip erasure disable control signal 40 and the like to low level to bring the flash memory into a disable state at step 102. Then, as a self-program is initiated in the normal mode, self-programming mode signal 70 becomes active, permitting rewrite control circuit 10 to know that the flash memory has transitioned to the self-programming mode. Upon knowing that the flash memory has transitioned to the self-programming mode, rewrite control circuit 10 sets all of the disable control signals such as write disable control signal 20, block erasure disable control signal 30, chip erasure disable control signal 40 and the like to high level to bring the flash memory into an enable state. The processing up to this step is represented by self-programming processing in the flow chart of FIG. 4.

When the flash memory is determined to be in the flash memory writer mode at step 101, rewrite control circuit 10 sets all of the disable control signals such as write disable control signal 20, block erasure disable control signal 30, chip erasure disable control signal 40 and the like to low level, as initial settings, to bring the flash memory into a disable state at step 103.

Next, at step 104, rewrite control circuit 10 reads the security flags respectively stored in the security flag storage areas of respective memory blocks $50_1$–$50_3$, causing each of write disable control signal generating circuit 11, block erasure disable control signal generating circuit 12 and chip erasure disable control signal generating circuit 11 to make a majority decision on the three write disable flags stored in the security flag storage areas of respective memory blocks $50_1$–$50_3$. Write disable control signal generating circuit 11 makes a majority decision on the three write disable flags stored in the respective security flag storage areas of three memory blocks $50_1$–$50_3$. Block erasure control signal generating circuit 12 makes a majority decision on the three block erasure disable flags stored in the respective security flag storage areas of three memory blocks $50_1$–$50_3$. Chip erasure disable control signal generating circuit 13 makes a majority decision on the three chip erasure disable flags stored in the respective security flag storage areas of three memory blocks $50_1$–$50_3$.

After the majority decisions on the security flags, rewrite control circuit 10 changes the logic of write disable control signal 20, block erasure disable control signal 30 and chip erasure disable control signal 40 based on the results of the majority decisions at step 105. When the majority decision results in a disable state, the logic of each disable control signal remains at low level.

With the control conducted as described above, rewrite control circuit 10 sets a disable/enable state for each of the disable control signals such as write disable control signal 20, block erasure disable control signal 30, chip erasure disable control signal 40 and the like based on the security flags stored in the respective security flag storage areas of memory blocks $50_1$–$50_3$.

According to the non-volatile semiconductor storage device of this embodiment, the security flags each indicative of a rewrite disable state are stored in the security flag storage areas provided in the storage area of the flash memory, and a disable/enable state is directly set by hardware such as rewrite disable control signal generating circuit 11, block erasure disable control signal generating circuit 12, chip erasure disable control signal 13 and the like, in accordance with the values of the stored security flags. Thus, for disabling a certain program stored in the flash memory to be subsequently rewritten, such as an erasure and an overwrite, when the security flags are set in accordance with particular behaviors which should be disabled, a malicious third party can be prevented from rewriting the stored program using a flash memory writer.

Also, in the non-volatile semiconductor storage device according to this embodiment, the security flags of the same contents are stored in three different memory blocks, such that rewrite control circuit 10 makes a majority decision on the values of the three security flags to determine a disable/enable state. Accordingly, even if an instantaneous power supply interruption or the like occurs during an erasure of a certain memory block to unintentionally rewrite the security flag in one memory block, the security flags stored in the two remaining memory blocks maintain the original values, thereby making it possible to prevent problems such as the validation of an unintended disable setting.

While in the foregoing embodiment, each of the write disable, block erasure disable and chip erasure disable flags has been described to have a 1-bit length, the present invention is not limited to this particular length of flags, but each flag may have a length of 2-bit or more. For example, each flag may be provided with two bits such that the flag set at "11" indicates an enabled erasure, while the remaining "10," "01," "00" indicate a disabled erasure.

Also, while the foregoing embodiment has been described for a flash memory which has three memory blocks for simplifying the description, the present invention is not limited to this particular flash memory. The number of memory blocks may be at least three or more for making a majority decision, so that the present invention can be applied in a similar manner to a flash memory having four or more memory blocks. It should be noted that all memory blocks need not be provided with a security flag storage area, and the number of memory blocks need not be the same as the number of security flag storage areas.

Further, in the foregoing embodiment, the flash memory is divided into three memory blocks, and each memory block is again divided into a security flag storage area and a user area, such that security flags of the same contents are stored in the respective security flag storage areas. Otherwise, similar effects can be produced if the security flags of the same contents can be stored in three or more areas which will never be erased simultaneously.

While a preferred embodiment of the present invention has been described using specific terms, such description is for illustrative purposes only, and it is to be understood that changes and variations may be made without departing from the spirit or scope of the following claims.

What is claimed is:

1. A non-volatile semiconductor storage device having a storage area made up of a plurality of memory blocks, wherein data is erased memory block by memory block, and at least three of said plurality of memory blocks store a security flag of the same content indicative of a rewrite disable state, said non-volatile semiconductor storage device comprising:

a rewrite control circuit for making a majority decision on the values of the three or more stored security flags to determine a rewrite disable/enable state to establish the logic of a disable control signal based on the result of the determination; and a means for controlling disablement or enablement of a rewrite to said storage area based on the logic of said disable control signal.

2. The non-volatile semiconductor storage device according to claim 1, wherein said security flag comprises a write disable flag indicative of a disable/enable state for a new data write into said storage area and a disable/enable state for an erasure in blocks; a block erasure disable flag indicative of a disable/enable state for an erasure in blocks; and a chip erasure disable flag indicative of a disable/enable state for a collective erasure of said overall storage area and a disable/enable state for an erasure in blocks, and said disable control signal comprises a write disable control signal, a block erasure disable control signal and a chip erasure disable control signal.

3. A rewrite disable control method for disabling a rewrite of data once written into a non-volatile semiconductor storage device, said method comprising the steps of:

storing a security flag indicative of a rewrite disable state in each of at least three areas which are not simultaneously erased, said security flags having the same contents;

making a majority decision on the value of the three stored security flags to determine a rewrite disable/enable state in a rewrite control circuit to establish the logic of a disable control signal based on the result of the determination; and controlling disablement or enablement of a rewrite into a storage area based on the logic of said disable control signal.

4. The non-volatile semiconductor storage device rewrite disable control method according to claim 3, wherein said security flag comprises a write disable flag indicative of a disable/enable state for a new data write into said storage area and a disable/enable state for an erasure in blocks; a block erasure disable flag indicative of a disable/enable state for an erasure in blocks; and a chip erasure disable flag indicative of a disable/enable state for a collective erasure of said overall storage area and a disable/enable state for an erasure in blocks, and said disable control signal comprises a write disable control signal, a block erasure disable control signal and a chip erasure disable control signal.

* * * * *